United States Patent [19]

Hennig

[11] Patent Number: 5,341,098

[45] Date of Patent: Aug. 23, 1994

[54] METHOD FOR THE GENERATION OF NMR SIGNALS WITH COHERENT PHASE PROFILE BY MEANS OF COMBINING RADIO FREQUENCY PULSES WITH INCOHERENT PHASE PROFILE

[75] Inventor: Jürgen Hennig, Freiburg, Fed. Rep. of Germany

[73] Assignee: Spectrospin AG, Fällanden, Switzerland

[21] Appl. No.: 21,433

[22] Filed: Feb. 22, 1993

[30] Foreign Application Priority Data

Feb. 26, 1992 [DE] Fed. Rep. of Germany ....... 4205780

[51] Int. Cl.$^5$ ............................................. G01R 33/20
[52] U.S. Cl. ........................................................ 324/309
[58] Field of Search ............... 324/300, 307, 309, 310, 324/311, 312, 313, 314, 318, 322; 128/653.2, 653.5

[56] References Cited

U.S. PATENT DOCUMENTS 4,543,959  10/1985  Sepponen ........................... 324/309
4,577,152  3/1986  Macovski .
5,196,795  3/1993  Bodenhausen et al. ............ 324/309

FOREIGN PATENT DOCUMENTS 0297832  6/1988  European Pat. Off. .

Primary Examiner—Michael J. Tokar
Attorney, Agent, or Firm—LaRiviere & Grubman

[57] ABSTRACT

In the case of a method for the generation of nuclear magnetic resonance (NMR) signals from a measuring volume with test substance which is exposed to a highly homogeneous stationary magnetic field $B_0$, by irradiation of a sequence of at least two radio frequency (RF)-pulses into the measuring volume, wherein the at least two RF-pulses excite nuclear spins of the test substance within the measuring volume in a resonant manner within a frequency band which is narrow with respect to their frequency, the phases of the at least two RF-pulses are selected in dependence upon their frequency in such a manner that the phases of the NMR signals generated by each individual of the at least two RF-pulses are randomised in such a manner that the vectorial sum over the signal intensities of the individual signals is zero, whereas the combination of the at least two RF-pulses leads to the development of observable coherent magnetization of the test substance. Due to the usage of these so-called "white" RF-pulses, undesired NMR signals in the case of multi-pulse excitations can be suppressed in a simple manner without application of additional gradients.

5 Claims, 2 Drawing Sheets

METHOD FOR THE GENERATION OF NMR SIGNALS WITH COHERENT PHASE PROFILE BY MEANS OF COMBINING RADIO FREQUENCY PULSES WITH INCOHERENT PHASE PROFILE

The invention relates to a method for the generation of nuclear magnetic resonance (NMR)-signals from a measuring volume with test substance which is exposed to a highly homogeneous stationary magnetic field $B_0$ by irradiation of a sequence of at least two radio-frequency (RF)-pulses into the measuring volume, wherein the at least two RF-pulses excite nuclear spins of the test substance within the measuring volume in a resonant manner within a frequency band which is narrow with respect to their frequency.

Such a method is known for example from U.S. Pat. No. 4,577,152.

In the case of nuclear magnetic resonance spectroscopy as well as with methods for NMR-imaging sequences of RF-pulses are irradiated into the measuring volume for the generation of NMR-signals which serve for the excitation of observable magnetization and comprise more than one RF-pulse. In the case of a simple conventional spin-echo-sequence for example the first RF-pulse serves for the excitation of a first free induction decay (FID) and in the simplest case a further RF-pulse serves for refocussing the FID-signal, so that at the end a spin-echo-signal can be observed. Of course, also the second as well as any further RF-pulse of a multi-pulse sequence generates an FID-signal for itself in each case. Since normally only the spin-echo-signal is to be observed, in this case all FID-signals are disturbing factors which contribute nothing to the actual measured variable and additionally sometimes even interfere therewith in a destructive manner.

The same problem is found in principle with all multi-pulse sequences which, in their combination, are to generate a certain measuring signal and additionally inevitably also cause a number of disturbing further NMR-signals. Therefore, it is an object of the present invention to present a method of the initially mentioned type, wherein the undesired signals which are always also generated in the case of multi-pulse excitation can be suppressed as according to requirements.

This object is achieved according to the invention in that the phases of the at least two RF-pulses are selected in dependence upon their frequency in such a manner that the phases of the NMR-signals which are generated by each individual RF-pulse of the two RF-pulses are randomised in such a manner that the vectorial sum over the signal intensities of the individual signals equals zero, whereas the combination of the two RF-pulses leads to the formation of observable coherent magnetization of the test substance.

The selection of a randomised phase profile of the narrow-banded excitation pulses has the effect that the FID-signals which are generated by the individual pulses comprise of signal intensities with incoherent phases which are not observable. By means of the corresponding phase selection in the case of the excitation pulses, the defined randomised phase profile of the associated NMR-signals can be formed in such a manner that the combination signals which are formed only by cooperation of several pulses of the excitation sequence show a coherent and thus observable magnetization of the test substance in the measuring volume- Thus, for example gradient switches can be left out which otherwise would be necessary for the selection of certain desired signals and for suppressing the other undesired signals.

In the case of an embodiment of the invention the sequence of at least two RF-pulses is a spin-echo-sequence for the NMR-imaging, wherein during the presence of a slice selection gradient firstly an RF-pulse is irradiated into the measuring volume which causes a uniform distribution of magnetizations in the direction of the slice selection gradient in the test substance, wherein this magnetization is then refocussed by means of a further RF-pulse in order to form a spin echo which is finally spatially encoded by a phase encoding gradient and is read during the presence of a read gradient and wherein the phases of the RF-pulses are selected such that they merely lead to the formation of a spin-echo, however, not to the formation of the respective free induction decays (FID).

In addition to the conventional spin-echo-sequence in a further embodiment of the invention also a multi-slice multi-echo pulse sequence can be used for the NMR-imaging.

In the case of a preferred embodiment of the method according to the invention in volume-selective spectroscopy, one RF-pulse in each case is irradiated in three consecutive slice selection steps into the measuring volume during the presence of one of three slice selection gradients, wherein each of the three used slice selection gradients is perpendicular to the two others such that a spin echo is generated from the magnetizations which are excited by the first RF-pulse and refocussed by the two following RF-pulses and is derived from the intersection volume of the three selected slices owing to the slice selectivity, in each of the three gradient directions and the phase of at least one of the three RF-pulses —preferably the one which directly precedes the one for the data recording—is selected such that the phases of the generated NMR-signals are randomised, whereafter the signal of the desired spin echo can be read out by means of a further pulse which is phase-modulated in a suitable manner, whereas the undesired NMR-signals are dephased and thus cannot be observed. Other methods for volume-selective spectroscopy, however, in which use is made of the randomisation of the phases of the generated NMR-signals, are known for example from U.S. Pat. No. 4,480,228.

Instead of preferring the spin-echo signal finally in a further embodiment of the method according to the invention also the stimulated echo signal may be preferred within the scope of volume-selective spectroscopy, whereas the spin-echo signal is being suppressed.

In this case in three consecutive slice selection steps one RF-pulse in each case is irradiated into the measuring volume during the presence of one of three slice selection gradients, wherein each of the three used slice selection gradients is perpendicular to the two others, such that by means of the two last RF-pulses a stimulated echo is generated from the magnetizations excited by the first RF-pulse, which is derived from the intersecting volume of the three selected slices owing to the slice selectivity in each of the three gradient directions, and the phases of the three RF-pulses are selected such that, owing to the randomization of the phases of the generated NMR-signals only the stimulated echo signal leads to an observable coherent magnetization of the test substance, whereas the other generated NMR-signals are not observable.

The invention is described and explained in more detail below with reference to the embodiments shown in the drawing. The features given in the description and in the drawing may be used in other embodiments of the invention individually or in any combination with one another. In the drawing.

The invention contains a type of radio frequency pulses for the NMR spectroscopy and nuclear spin tomography of which the excitation profile is narrow-banded, such that they can be used for the excitation of spins within a limited frequency range. On the other hand the main characteristic of these pulses consists in that the phase of the transverse magnetization excited by these pulses—the so-called phase profile—is randomised (however defined) in dependence upon the excitation frequency, such that the vectorial sum over the excitation profile becomes equal to zero. Such pulses are referred to in the following as "white pulses".

If the signal generated by these pulses is read out in such a manner that, at the time of reading the data, it is not distinguished between the magnetizations which precess at different Larmor frequencies during the pulse, the generated signal shows an intensity of zero, i.e. although transverse magnetization was excited, an observable signal is not generated.

Figure 1:
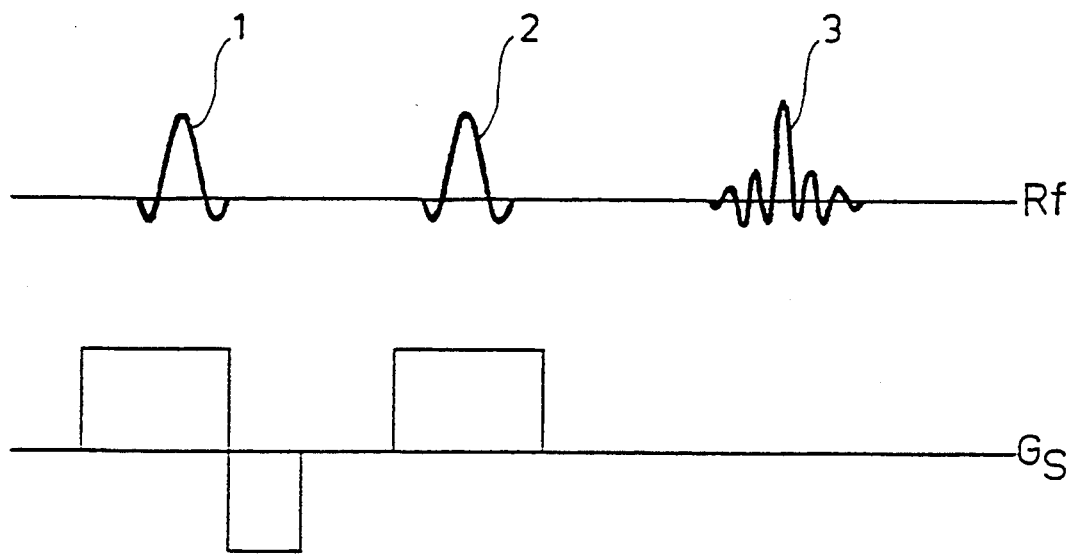
FIG. 1 shows a diagram of a pulse sequence for the generation of a spin echo by means of an excitation pulse as well as a refocussing pulse which are applied in the presence of a magnetic field gradient $G_s$.

A typical case is the use of slice-selective pulses in the case of which a magnetic field gradient is present at the time of the pulse, however is no longer present at the time of reading out. An example for such a slice-selective pulse sequence is shown in FIG. 1, wherein in the presence of the slice selection gradient $G_s$, firstly, an excitation pulse 1 and then a refocussing pulse 2 is irradiated into the measuring volume in order to generate a spin echo 3.

Measuring sequences which require two or more pulses (as for example a spin echo sequence) lead to the generation of several signals. In the case of two pulses this is the free induction decay from each individual pulse as well as the actual spin echo. When using white pulses the phase profile of each pulse can be designed such that only one single signal is generated from the multitude of possible signals. In the following the nature of such pulses is explained by means of example of a spin echo sequence for the generation of a slice selective image in nuclear magnetic resonance tomography.

A spin echo sequence consists of a sequence of two radio frequency pulses. In principle three signals are generated from two pulses, namely one free induction decay (FID) from each pulse in each case as well as the spin echo. The phase $\phi$ of each of these signals depends therein on the phase of the pulse for the respective observation frequency $\omega$. In this connection the following is valid:

$$\phi_{FID1} = \alpha_1(\omega) + 90° \qquad (1)$$

$$\phi_{FID2} = \alpha_2(\omega) + 90° \qquad (2)$$

$$\phi_{SE} = 2\cdot\alpha_2(\omega) - (\alpha_1(\omega) + 90°), \qquad (3)$$

wherein $\phi_{FID1}$ and $\phi_{FID2}$ characterise the phases of the two FID, $\phi_{SE}$ characterises the phase of the spin echo, $\alpha_1(\omega)$ characterises the phase of the first pulse for the frequency $\omega$ and $\alpha_2(\omega)$ characterises the phase of the second pulse for the frequency $\omega$.

The aim is now to make $\phi_{SE}$ within the excitation bandwidth independent from $\omega$ such that the generated signals of different frequencies add in a coherent manner to a signal of the phase $\gamma$ wherein $\alpha_1(\omega)$ and $\alpha_2(\omega)$ are at the same time selected such that the phase profile of each pulse is randomised and thus the intensity of the two FID becomes zero in the case of a homogeneous distribution of the magnetization over the excitation bandwidth.

From (1), (2) and (3) thus directly follows $$\alpha_2(\omega) = (\gamma + \alpha_1(\omega) + 90°)/2. \qquad (4)$$

Thus, if a pulse with a randomised phase $\alpha_1(\omega)$ and a second pulse of the phase $\alpha_2(\omega)$ according to equation (4) is generated, a spin echo signal of the same intensity as with the use of conventional pulses of which the excitation profile does not comprise a randomised phase, but has the same amplitude $A_1(\omega)$ and $A_2(\omega)$ can be achieved-. The intensities of the respective FID will, however, be zero in contrast to the use of conventional pulses.

Applications for such pulses can be found in cases, where conventional methods for the elimination of undesired signals are either not sufficient or seem unsuitable- Methods for this purpose which have been known so far use on the one hand additional gradients which force only the desired signal to be refocussed but not the undesired signals. In the case of the above-mentioned spin echo experiment this is fulfilled for example by two gradients which are symmetrical to the second pulse. If, in order to improve the signal-to-noise ratio, several signals are added by repeating the experiment, also phase cycles of the reference phase of both pulses can be applied for the selection of the desired signal.

The first possibility is not applicable if for example the timing of the measuring sequence does not allow the application of additional gradients, as it is the case for example with spin echo sequences with possibly short echo times. In the case of sequences which require a repeated excitation (MR-imaging, n-dimensional Fourier transform experiments), furthermore a refocussing effect appears which causes consecutive signals to appear in further recording cycles. Also in the case of volume selective spectroscopy often the application of additional gradients is not allowed owing to the eddy currents which are connected with additional gradient switching.

When white pulses are used for any measuring sequence with n pulses an equation system according to (1) to (3) can be set up for the phase of all relevant signals. In the case of free selection of the randomised phase profiles $\alpha_1(\omega) \ldots \alpha_{n-1}(\omega)$ for $n-1$ pulses then the phase profile $\alpha_n(\omega)$ of the n-th pulse can be calculated such that the desired signal has a coherent phase $\gamma$.

The principle of this way of proceeding can be changed such that each of the signals of $n-1$ pulses is firstly generated in a "coded" manner and does not lead to any observable magnetization. The n-th pulse then contains in its phase profile the key for decoding the desired signal, wherein all other signals remain still coded.

In addition to the applications from MR tomography already mentioned (fast spin echo sequence, volume-selective spectroscopy) it is to be mentioned that white pulses can be used also in the case of experiments in which no spatial resolution is desired. Thus, in the easiest case a spin echo sequence for the NMR spectroscopy as shown in FIG. 1 can be established, wherein the gradients $G_s$ under pulses 1, 2 have the only purpose to achieve a uniform distribution of the magnetizations under the excitation pulse 1. The actual recording of data of the spin echo 3 is then performed without any gradient such that an NMR spectrum is recorded. The strength of the gradient and the spectral width of the excitation profile are then to be selected such that the selected slice comprises the entire test sample.

Applications of white pulses for complex multi-pulse experiments, as for example n-dimensional Fourier transform experiments are readily feasible for the expert from the above description and are therefore not described in detail herein.

Figure 2:
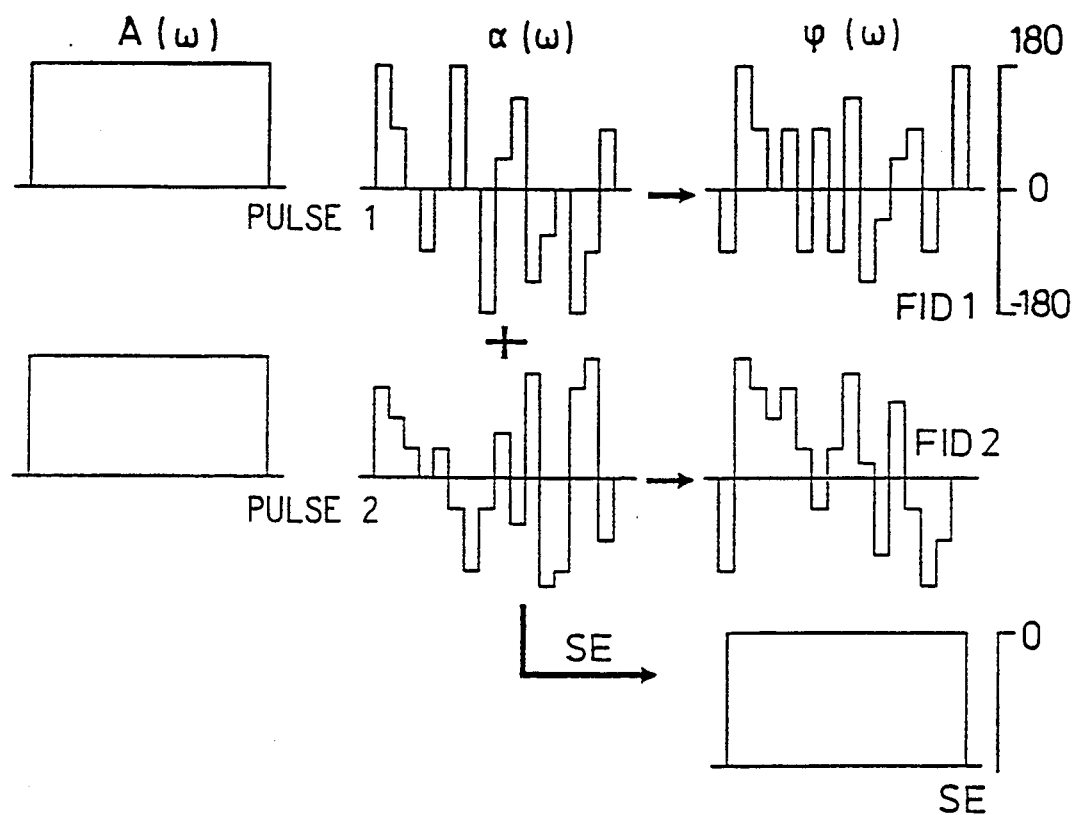
FIG. 2 shows a diagram of a sequence of "white" pulses for the generation of a coherent spin echo.

FIG. 2 shows an example of the use of white pulses according to the invention for the generation of a coherent spin echo. The first line gives on the lefthand side the excitation amplitude $A_1(\omega)$, in an idealised manner, of the pulse 1, which functions as excitation pulse, the centre column shows the phase profile $\alpha_1(\omega)$ of this pulse and the righthand column shows the phase profile $\phi_1(\omega)$ of the transverse magnetization excited for a free induction decay (FID1). In the second line the excitation profile $A_2(\omega)$, the phase profile $\alpha_2(\omega)$ and $\phi_2(\omega)$ respectively, of the pulse 2 as well as of the consecutive FID2 for the refocussing pulse are shown. The last line shows that the phase profile of the spin echo SE generated by both pulses is coherent and leads to observable transverse magnetization, whereas the phase profile of FID1 and FID2 shows that the magnetizations are present in a dephased manner.

In the following a method for generating randomised pulses is described.

Phase-modulated radio frequency pulses which generate a discrete band of excitation frequencies with possibly the same amplitude within the narrow-banded excitation range, however having a phase randomised in dependence upon the measuring sequence, are generated in general in a discrete form, i.e. the pulse is described as a time sequence of a discrete pattern of an RF-field $B_1$ with defined phase and amplitude.

For the time development of the entire magnetization described by the longitudinal magnetization $M_z$ as well as the transverse magnetizations $M_x$ and $M_y$ in a radio frequency pulse which changes with time and is described by components $B_{1x}(t)$ and $B_{1y}(t)$ the Bloch equations are valid:

$$dM_z/dt = -M_y \cdot \gamma \cdot B_{1x}(t) + M_x \cdot \gamma \cdot B_{16}(t) - (M_o - M_z)/T_1 \quad (5)$$

$$dM_y/dt = M_z \cdot \gamma \cdot B_{1x}(t) - M_x \cdot \gamma \cdot \omega - M_y/T_2 \quad (6)$$

$$dM_x/dt = -M_z \cdot \gamma \cdot B_{1y}(t) + M_y \cdot \gamma \cdot \omega - M_x/T_2 \quad (7)$$

wherein the last terms in each case, which describe the relaxation, are generally not taken into consideration, since the entire duration of the pulse is short compared to the relaxation times.

For the amplitude $I(t)$ of the radio frequency pulse, the following is valid:

$$I(t)^2 = B_{1x}(t) + B_{1y}(t), \quad (8)$$

for the phase $\psi(t)$ the following is valid:

$$\tan(\psi/t) = B_{1x}(t)/B_{1y}(t) \quad (9)$$

The excitation amplitude $A(\omega)$ and the phase profile $\alpha(\omega)$ of the excited magnetizations thus are given by numerical integration of equations (5) to (7) over the duration of the pulse. Formally $I(t)$ and $\omega(t)$ can consequently be described by inversion of the numerical calculation for a profile $A(\omega)$=const. and $\alpha(\omega)$=rand. (randomised) in the integral $\omega_1$ to $\omega_2$, which is to correspond to the excitation bandwidth of the pulse. In this connection it has to be considered that, owing to the finite time duration of the pulse and of the desired discrete excitation pulse, such a solution can be achieved only as an approximate value, since from the signal theory it follows that discrete pulses in the time or frequency domain always cause exactly infinitely extended profiles in the respective other domain.

In literature a large amount of algorithms is described of how the approximate calculation can be carried out. These algorithms use different types of description of the pulses ("time-domain-" or "Fourier component-presentation") as well as different strategies and optimising conditions for the iterative or non-iterative adjustment to a given excitation profile $A(\omega)$, $\alpha(\omega)$.

We do not want to explain the advantages and disadvantages of the individual methods in more detail; they are known by the expert and are readily feasible.

A very simple and practicable kind of generating pulses which suffice the above criterium, consists in the application of the superposition principle. The pulse with the excitation profile from $\omega_1$ to $\omega_n$ is described therein by a superposition of individual pulses which comprise a different discrete excitation profile, in each case, with a phase which is different in each case such that the entire profile can be described as:

$$A(\omega_1,\omega_n) = A_1(\omega_1,\omega_2) + A_2(\omega_2,\omega_3) + A_3(\omega_3,\omega_4) \ldots A_{n-1}(\omega_{n-1}, \omega_n) \quad (10)$$

and $$\alpha(\omega_1,\omega_n) = \alpha_1(\omega_1,\omega_2) + \alpha_2(\omega_2,\omega_3) + \alpha_3(\omega_3,\omega_4) \ldots \alpha_{n-1}(\omega_{n-1},\omega_n) \quad (11)$$

If as profile of the partial pulses: $A_{m'1}(\omega_{m-1},\omega_m)$, $\alpha_{m-1}(\omega_{m-1},\omega_m)$ pulses with an optimised rectangular profile are taken, as described in the literature and which can be described by a time-limited $B_1$-field $I(t)$, $\psi(t)$, by means of variation of the phase $\psi(t)$ of the respective partial pulses by a phase change $\Delta\psi(t)$ according to equations (10) and (11), which is constant for the respective individual pulse, but is randomised from individual pulse to individual pulse, a pulse which is sufficiently suitable for being used in the method according to the invention can be generated if a sufficient number of individual pulses (typically >10) is used.

The phase profiles of the other pulses which are necessary for generating one individual signal from the multitude of all signals generated from a sequence of pulses, can then be generated by using equation (4) or one equation which is analogous to the discussed problem by means of pulses according to the superposition principle.

I claim:

1. A method for the measurement of nuclear magnetic resonance (NMR) signals from a measuring volume of a test substance comprising the steps of:

a) exposing the test substance to a stationary homogeneous magnetic field $B_0$;
b) selecting, for measuring a first NMR signal, a first radio frequency (RF) pulse with a first pulse frequency, a first pulse frequency band having a and-width which is narrow with respect to the first pulse frequency, and a first pulse phase distribution within the first pulse frequency band;
c) selecting, for measuring at least one additional NMR signal, at least one additional RF pulse, each additional pulse having an additional pulse frequency, an additional pulse frequency band having a band-width which is narrow with respect to the additional pulse frequency, and an additional pulse frequency phase distribution within the additional pulse frequency band;
d) determining phase distributions of the first and the additional RF pulses in dependence on the first and additional pulse frequency bands for measuring the first and the additional NMR signals having first and additional NMR signal phases which are randomized for causing a vectorial sum over each of the first and additional signals to be zero while the combined first and additional RF pulses result in formation of an observable coherent magnetization of the test substance; and
e) irradiating the first and additional RF pulses into the measuring volume to resonantly excite nuclear spins of the test substance within the measuring volume for generating the first and additional NMR signals.

2. The method of claim 1 wherein, in steps b) and c), the first and additional RF pulses are selected to be pulses of a spin echo sequence for measuring a first and at least one additional free induction NMR signal, and, in step d), the first and the additional RF pulse phase distributions are determined to cause the first and additional free induction signals to each be zero while the combined first and additional RF pulses result in the formation of a spin echo signal, the method further comprising the steps of:
applying, during irradiation of the first RF pulse in step e), a slice selection gradient having a direction to the measuring volume to cause a uniform distribution of magnetization in the test substance in the direction of the slice selection gradient;
refocussing, by means of irradiation of the additional RF pulse in step e), the uniform distribution of magnetization in order to form the spin echo signal;
applying a phase encoding gradient to spatially encode the spin echo signal; and
applying, during the presence of the spin echo signal, a read gradient.

3. The method of claim 2 wherein a multi-slice, multi-echo sequence sequence is executed.

4. A method for the measurement of nuclear magnetic resonance (NMR) signals from a measuring volume of a test substance using a spin echo pulse sequence comprising the steps of:
a) exposing the test substance to a stationary homogeneous magnetic field $B_0$;
b) selecting, for measuring a first NMR signal, a first radio frequency (RF) pulse with a first pulse frequency, a first pulse frequency band having a band-width which is narrow with respect to the first pulse frequency, and a first pulse phase distribution within the first pulse frequency band;
c) selecting, for measuring a second NMR signal, a second RF pulse with a second pulse frequency, a second pulse frequency band having a band-width which is narrow with respect to the second pulse frequency, and a second pulse phase distribution within the second pulse frequency band;
d) selecting, for measuring a third NMR signal, a third RF pulse with a third pulse frequency, a third pulse frequency band having a band-width which is narrow with respect to the third pulse frequency, and a third pulse phase distribution within the third pulse frequency band;
e) selecting, for measuring at least one additional NMR signal, at least one additional RF pulse, each additional pulse having an additional pulse frequency, an additional pulse frequency band having a band-width which is narrow with respect to the additional pulse frequency, and an additional pulse frequency phase distribution within the additional pulse frequency band;
f) determining phase distribution of the first, second, third, and additional RF pulses in dependence on the first, second, third, and additional RF pulse frequency band, for measuring the first, second, third, and additional NMR signals having first, second, third, and additional NMR signal phases which are randomized for causing a vectorial sum over each of the first, second, third, and additional NMR signals to be zero while the combined first, second, third, and additional RF pulses lead to the formation of an observable spin echo signal; and
g) consecutively irradiating the first, second, third, and additional pulses into the measuring volume, each of the first, second, and third pulses being irradiated in the presence of a first, second, and third slice selection gradient with each slice selection gradient having a direction perpendicular to the directions of the two other slice selection gradients, to excite a magnetization with the first pulse and to refocus the magnetization with the second and third pulses for generating a spin echo signal from a portion of the test substance located in a slice selection intersection volume of the three slice selection gradients.

5. A method for the measurement of nuclear magnetic resonance (NMR) signals from a measuring volume of a test substance using a stimulated echo pulse sequence comprising the steps of:
a) exposing the test substance to a stationary homogeneous magnetic field $B_0$;
b) selecting, for measuring a first NMR signal, a first radio frequency (RF) pulse with a first pulse frequency, a first pulse frequency band having a band-width which is narrow with respect to the first pulse frequency and a first pulse phase distribution within the first pulse frequency band;
c) selecting, for measuring a second NMR signal, a second RF pulse with a second pulse frequency, a second pulse frequency band having a band-width which is narrow with respect to the second pulse frequency, and a second pulse phase distribution with the second pulse frequency band;
d) selecting, for measuring a third NMR signal, a third RF pulse with a third pulse frequency, a third pulse frequency band having a band-width which is narrow with respect to the third pulse frequency, and a third pulse phase distribution within the third pulse frequency band;

e) selecting, for measuring at least one additional NMR signal, at least one additional RF pulse, each additional pulse having an additional pulse frequency, an additional pulse frequency band having a band-width which is narrow with respect to the additional pulse frequency, and an additional pulse frequency phase distribution within the additional pulse frequency band;

f) determining phases for the first, second, third, and additional RF pulse frequency distributions in dependence on the first, second, third, and additional RF pulse frequency bands for measuring the first, second, third, and additional NMR signals having first, second, third, and additional signal phases which are randomized for causing a vectorial sum over each of the first, second, third, and additional signals to be zero while the combined first, second, third, and additional RF pulses lead to the formation of an observable stimulated echo signal; and g) consecutively irradiating the first, second, third, and additional pulses into the measuring volume, each of the first, second, and third pulse irradiations being carried out in the presence of a first, second, and third slice selection gradient with each slice selection gradient having a direction which is perpendicular to the directions of the two other slice selection gradients, to excite a magnetization with the first pulse and to generate, with the second and third pulses, a stimulated echo signal from the excited magnetization, the stimulated echo signal emanating from a portion of the test substance located in a slice selection intersection volume of the three slice selection gradient.

* * * * *